(12) United States Patent
Hikima

(10) Patent No.: US 7,924,416 B2
(45) Date of Patent: Apr. 12, 2011

(54) MEASUREMENT APPARATUS, EXPOSURE APPARATUS, AND DEVICE MANUFACTURING METHOD

(75) Inventor: Ikuo Hikima, Kawasaki (JP)

(73) Assignee: Nikon Corporation, Tokyo (JP)

( * ) Notice: Subject to any disclaimer, the term of this patent is extended or adjusted under 35 U.S.C. 154(b) by 247 days.

(21) Appl. No.: 11/471,666

(22) Filed: Jun. 21, 2006

(65) Prior Publication Data

US 2007/0097341 A1 May 3, 2007

Related U.S. Application Data

(60) Provisional application No. 60/792,617, filed on Apr. 18, 2006.

(30) Foreign Application Priority Data

Jun. 22, 2005 (JP) ................................. 2005-181712

(51) Int. Cl.
*G01J 1/42* (2006.01)
*G03B 27/42* (2006.01)
(52) U.S. Cl. .......................................... 356/218; 355/53
(58) Field of Classification Search .................. 355/30, 355/53, 68; 257/467; 250/208.1; 356/121, 356/218
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,610,683 A | 3/1997 | Takahashi | |
| 5,715,039 A | 2/1998 | Fukuda et al. | |
| 5,825,043 A | 10/1998 | Suwa | |
| 5,969,441 A | 10/1999 | Loopstra et al. | |
| 6,115,107 A | 9/2000 | Nishi | |
| 6,208,407 B1 | 3/2001 | Loopstra | |
| 6,549,277 B1 | 4/2003 | Narushima et al. | |
| 6,590,634 B1 | 7/2003 | Nishi et al. | |
| 6,611,316 B2 | 8/2003 | Sewell | |
| 6,690,455 B2 * | 2/2004 | Fujinaka | 356/121 |
| 6,707,528 B1 | 3/2004 | Aoyama et al. | |
| 6,721,034 B1 | 4/2004 | Horikawa | |
| 6,778,257 B2 | 8/2004 | Bleeker et al. | |
| 6,897,963 B1 | 5/2005 | Taniguchi et al. | |
| 6,952,253 B2 | 10/2005 | Lof et al. | |
| 2001/0050769 A1 | 12/2001 | Fujinaka | |
| 2003/0226951 A1 * | 12/2003 | Ye et al. | 250/208.1 |
| 2004/0031340 A1 * | 2/2004 | Renken | 73/866.1 |

(Continued)

FOREIGN PATENT DOCUMENTS

DE     221563 A1     4/1985

(Continued)

OTHER PUBLICATIONS

Translation of PCT/JP2004/007417 corresponding to publication WO 2005010611.*

(Continued)

*Primary Examiner* — Hung Henry Nguyen
*Assistant Examiner* — Steven H Whitesell-Gordon
(74) *Attorney, Agent, or Firm* — Oliff & Berridge, PLC

(57) ABSTRACT

A substrate stage holds a substrate irradiated with exposure light via a liquid. A measurement apparatus measures information on the exposure light and has a light receiving device detachable from the substrate stage. The light receiving device receives the exposure light while being held in the substrate stage.

5 Claims, 8 Drawing Sheets

U.S. PATENT DOCUMENTS

| | | |
|---|---|---|
| 2004/0165159 A1 | 8/2004 | Lof et al. |
| 2005/0006563 A1* | 1/2005 | Matheus Baselmans et al. .................. 250/208.1 |
| 2006/0077367 A1 | 4/2006 | Kobayashi et al. |
| 2006/0082744 A1 | 4/2006 | Hirukawa |
| 2006/0098179 A1 | 5/2006 | Hirukawa |
| 2006/0170891 A1 | 8/2006 | Nishinaga et al. |
| 2006/0176457 A1 | 8/2006 | Ishii et al. |
| 2006/0181690 A1 | 8/2006 | Nishinaga et al. |

FOREIGN PATENT DOCUMENTS

| | | |
|---|---|---|
| DE | 224448 A1 | 7/1985 |
| EP | 1 628 330 A1 | 2/2006 |
| EP | 1 650 787 A1 | 4/2006 |
| EP | 1 670 043 A2 | 6/2006 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-305915 | 10/1992 |
| JP | A 04-305917 | 10/1992 |
| JP | A 05-062877 | 3/1993 |
| JP | A 06-124873 | 5/1994 |
| JP | A 07-220990 | 8/1995 |
| JP | A 07-240366 | 9/1995 |
| JP | A 08-130179 | 5/1996 |
| JP | A 08-316125 | 11/1996 |
| JP | A 10-092722 | 4/1998 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 11-260706 | 9/1999 |
| JP | A 2000-058436 | 2/2000 |
| JP | A 2000-505958 | 5/2000 |
| JP | A 2000-164504 | 6/2000 |
| JP | A 2001-510577 | 7/2001 |
| JP | A 2001-338868 | 12/2001 |
| JP | A 2004-519850 | 7/2004 |
| JP | A 2004-289126 | 10/2004 |
| JP | A 2005-012201 | 1/2005 |
| JP | A-2005-93948 | 4/2005 |
| JP | A 2005-093948 | 4/2005 |
| JP | A-2005-116570 | 4/2005 |
| JP | A 2005-116570 | 4/2005 |
| JP | A 2005-129914 | 5/2005 |
| WO | WO 99/23692 | 5/1999 |
| WO | WO 99/23692 A1 | 5/1999 |
| WO | WO 99/28790 A1 | 6/1999 |
| WO | WO 99/49504 A1 | 9/1999 |
| WO | WO 01/35168 A1 | 5/2001 |
| WO | WO 2004/019128 A2 | 3/2004 |
| WO | WO 2004/105107 | 12/2004 |
| WO | WO 2004105107 A1 * | 12/2004 |
| WO | WO 2005/010960 A1 | 2/2005 |
| WO | WO 2005010611 A2 * | 2/2005 |

OTHER PUBLICATIONS

International Search Report issued in International Patent Application No. PCT/JP2006/312414 mailed on Oct. 3, 2006 (w/English Translation).

Written Opinion of the International Searching Authority issued in International Patent Application No. PCT/JP2006/312414 mailed on Oct. 3, 2006 (w/English Translation).

* cited by examiner

MEASUREMENT APPARATUS, EXPOSURE APPARATUS, AND DEVICE MANUFACTURING METHOD

CROSS-REFERENCE TO RELATED APPLICATION

This application is a non-provisional application claiming benefit of provisional application No. 60/792,617, filed Apr. 18, 2006, and claims priority to Japanese Patent Application No. 2005-181712, filed Jun. 22, 2005, the contents of which are incorporated herein by reference.

BACKGROUND OF THE INVENTION

1. Field of the Invention

The present invention relates to a measurement apparatus for measuring information on exposure light, an exposure apparatus for exposing a substrate via a liquid, and a device manufacturing method.

2. Description of Related Art

In a photolithographic process, one of manufacturing processes of micro devices (electronic devices, etc.) such as semiconductor devices, an exposure apparatus is used that exposes a pattern image on a photosensitive substrate. When a plurality of exposure apparatuses are concurrently used in manufacturing lines of micro devices, light exposure amount (dose amount) among the exposure apparatuses need to be matched in order to decrease variance or the like in products manufactured in each exposure apparatus. For example, technologies for matching light exposure amount among exposure apparatuses by using a photometer capable of measuring relative light intensity among the exposure apparatuses (See, for example, Japanese Unexamined Patent Publication, First Publication Nos. H10-92722, H11-260706, and 2001-338868).

Although a liquid immersion exposure apparatus that exposes a substrate via a liquid is invented aiming at higher resolution, etc. of an exposure apparatus, there is a need for matching exposure amounts among a plurality of liquid immersion exposure apparatuses also when the liquid immersion exposure apparatuses are concurrently used in a micro device line. Therefore, there is a need for an inventive technology for smoothly measuring information on exposure light of each of a plurality of liquid immersion exposure apparatuses.

SUMMARY OF THE INVENTION

An object of the present invention is to provide a measurement apparatus capable of smoothly measuring information on exposure light of each of a plurality of liquid immersion exposure apparatuses. Another object of the present invention is to provide an exposure apparatus in which information on exposure light is measured by the measurement apparatus and a method of manufacturing a device that uses the exposure apparatus.

According to a first aspect of the present invention, there is provided a measurement apparatus for measuring information on exposure light, the measurement apparatus including a light receiving system that is detachable from a substrate stage and receives the exposure light while being held by the substrate stage, the substrate stage holding a substrate, the substrate stage irradiated with the exposure light via a liquid.

According to the first aspect of the present invention, for example, information on respective exposure light of a plurality of liquid immersion exposure apparatuses can be smoothly measured via a liquid.

According to a second aspect of the present invention, there is provided an exposure apparatus for exposing a substrate with exposure light via a liquid, the exposure apparatus including a movable body for detachably supporting the measurement apparatus of the above-described aspect.

According to the second aspect of the present invention, an exposure process can be performed with good accuracy using the measurement apparatus of the above-described aspect.

According to a third aspect of the present invention, there is provided a manufacturing method of a device that uses the exposure apparatus of the above-described aspect.

According to the third aspect of the present invention, a device can be manufactured using an exposure apparatus that can perform an exposure process with good accuracy.

DETAILED DESCRIPTION OF THE INVENTION

Hereunder is a description of embodiments of the present invention with reference to the drawings. However the present invention is not limited to this description. In the following description, an XYZ rectangular co-ordinate system is established, and the positional relationship of respective members is described with reference to this XYZ rectangular co-ordinate system. A predetermined direction within a horizontal plane is made the X axis direction, a direction orthogonal to the X axis direction in the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX, the θY, and the θZ directions respectively.

First Embodiment

Figure 1:
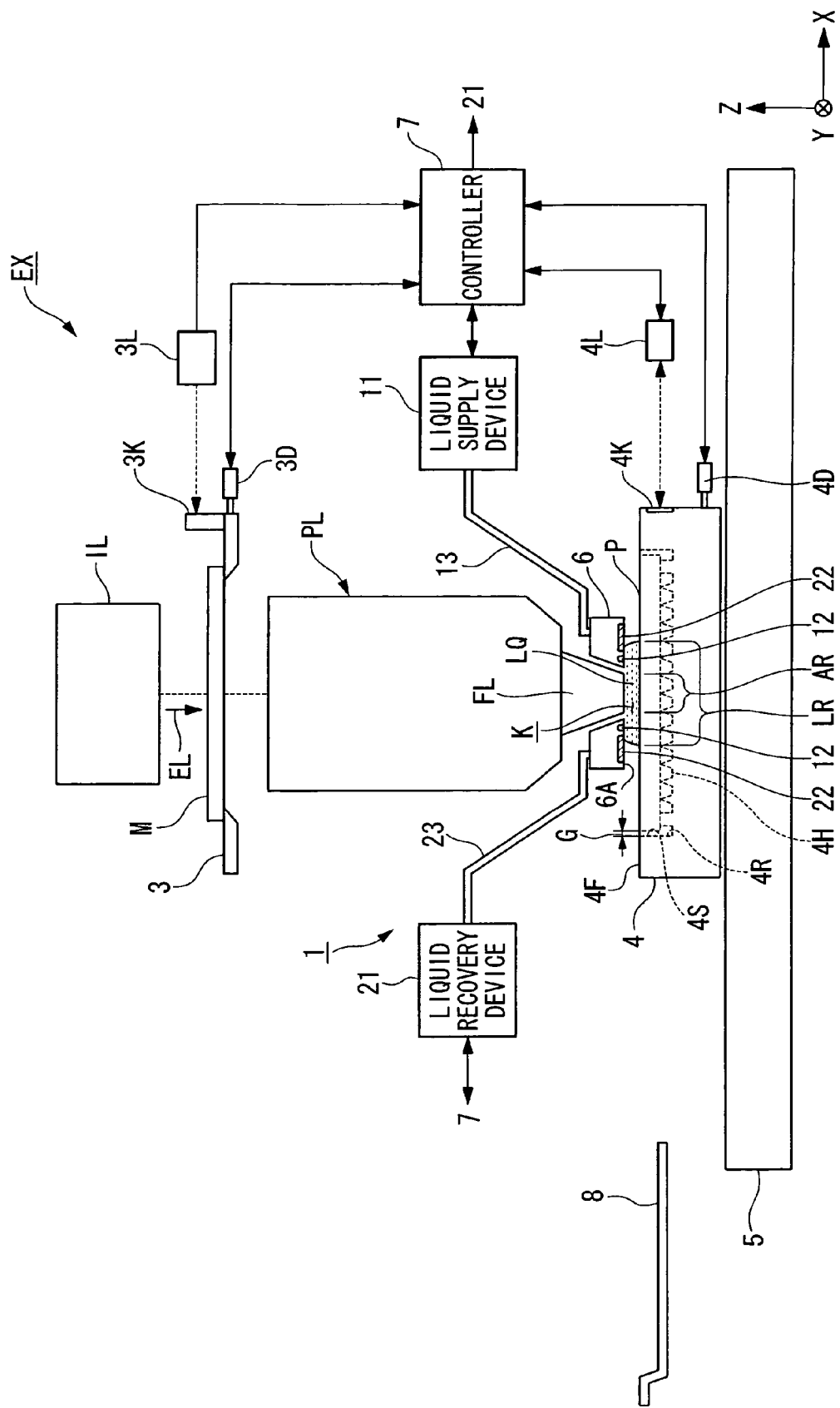
FIG. 1 is a schematic block diagram showing an exposure apparatus according to a first embodiment.

A first embodiment will be described. FIG. 1 is a schematic block diagram showing an exposure apparatus EX according to a first embodiment. In FIG. 1, the exposure apparatus EX includes: a mask stage 3 that is movable while holding a mask M; a substrate stage 4 that is movable while holding a substrate P; an illumination optical system IL that illuminates the mask M held on the mask stage 3 with exposure light EL; a projection optical system PL that projects a pattern image of the mask M illuminated with the exposure light EL onto the substrate P; and a controller 7 that controls the operation of the whole exposure apparatus EX. The exposure apparatus EX includes a transfer apparatus 8 for transferring the substrate P to the substrate stage 4, such as disclosed in Japanese Unexamined Patent Publication, First Publication No. H7-240366.

The substrate here includes one a sensitive material (photoresist) is spread on a substrate of a semiconductor wafer or the like, and includes a reticle formed with a device pattern which is reduction size projected onto the substrate. In the present embodiment, a transmission mask is used as the mask, however a reflecting mask may be used.

The exposure apparatus EX of the present embodiment is a liquid immersion exposure apparatus applicable to a liquid immersion method for substantially shortening the exposure length and improving the resolution, and also substantially expanding the depth of focus. It comprises; a liquid immersion mechanism 1 that fills an optical path space K of the exposure light EL on the image plane side of the projection optical system PL with a liquid LQ to form a liquid immersion region LR of the liquid LQ on the substrate P. The exposure apparatus EX fills the optical path space K with the liquid LQ by using the liquid immersion mechanism 1, at least while projecting the pattern image of the mask M on the substrate P. The exposure apparatus EX projects the pattern image of the mask M on the substrate P by irradiating the substrate P with the exposure light EL having passed through the mask M via the projection optical system PL and the liquid LQ filled in the optical path space K. Furthermore, the exposure apparatus EX adopts a local liquid immersion method in which the liquid LQ filled in the optical path space K locally forms the liquid immersion region LR that is larger than a projection region AR and smaller than the substrate P in a part of the region on the substrate P including the projection region AR of the projection optical system PL. In this embodiment, purified water is used as the liquid LQ.

The illumination optical system IL is one which illuminates a predetermined illumination region on the mask M with exposure light EL of a uniform luminance distribution. For the exposure light EL radiated from the illumination optical system IL, for example emission lines (g-ray, h-ray, i-ray), radiated for example from a mercury lamp, deep ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, the ArF excimer laser beam is used.

The mask stage 3 can move in the X-axis, Y-axis, and θZ directions while holding the mask M, with drive of a mask stage driving device 3D including an actuator such as a linear motor. Position information of the mask stage 3 (and consequently the mask M) is measured by a laser interferometer 3L. The laser interferometer 3L measures the position information on the mask stage 3 by using a movement mirror 3K provided on the mask stage 3. The controller 7 drives the mask stage driving device 3D based on the measurement result of the laser interferometer 3L to position-control the mask M held on the mask stage 3.

The movement mirror 3K may include not only a plane mirror but also a corner cube (retroreflector), and that reflection surface formed by mirror-machining an end surface (side surface) of the mask stage 3 may be used instead of fixedly providing the movement mirror 3K on the mask stage 3. Furthermore, the mask stage 3 may have a configuration to allow coarse/fine movement, disclosed in, for example, Japanese Unexamined Patent Application, First Publication No. H8-130179 (corresponding U.S. Pat. No. 6,721,034).

The projection optical system PL is for projecting a pattern image of the mask M onto the substrate P at a predetermined projection magnification and has a plurality of optical elements, and those optical elements are held by a lens barrel PK. The projection optical system PL of this embodiment is a reduction system having the projection magnification of, e.g., ¼, ⅕, or ⅛ and forms a reduced image of the mask pattern in the projection region AR conjugate with the above-described illumination area. The projection optical system PL may be any of a reduction system, an equal system and a magnifying system. Furthermore, the projection optical system PL may be any of a refractive system without a reflective optical element, a reflective system without a refractive optical element, and cata-dioptric system with a reflective element and a refractive element. Moreover, the projection optical system PL may form either an inverted image or an erect image. In this embodiment, among a plurality of optical elements of the projection optical system PL, only the final optical element FL that is nearest the image plane is to be contact with the liquid LQ in the optical path space K.

The substrate stage 4 has a substrate holder 4H that holds the substrate P, and can move above a base member 5 with the substrate P being held by the substrate holder 4H. The substrate holder 4H is placed in the recess portion 4R provided on the substrate stage 4, and the upper surface 4F other than the recess portion 4R of the substrate stage 4 is flat such that it is at substantially the same height as (flush with) the surface of the substrate P. This is because, for example, a part of the liquid immersion region LR is formed on the upper surface 4F as a result of running out from the surface of the substrate P in the exposure operation of the substrate P. Only a part of the upper surface of the substrate stage 4, e.g., a predetermined region surrounding the substrate P (including the region where the liquid immersion region LR runs out) may be at substantially the same height as the surface of the substrate P. The upper surface 4F of the substrate stage 4 has liquid-repellency to the liquid LQ. In this embodiment, the upper surface 4F is formed of a material with liquid-repellency, e.g., a fluorine-based material such as polytetrafluoroethylene (Teflon (registered trademark)) or an acryl-based material. There may be a step between the surface of the substrate P which is held in the substrate holder 4H, and the upper surface 4F of the substrate stage 4. Furthermore, the substrate holder 4H may be formed as one with one part of the substrate stage 4. However, in the present embodiment, the substrate holder 4H and the substrate stage 4 are made separate, and the substrate holder 4H is secured in the substrate stage 4 by, for example, vacuum attraction.

Furthermore, the substrate stage 4 has an inner side surface 4S that faces the side surface of the substrate P held by the substrate holder 4H. The inner side surface 4S is a surface inside the recess portion 4R. Between the side surface of the substrate P held by the substrate holder 4H and the inner side surface 4S of the substrate stage 4, a gap G of, e.g., about 0.1 to 1 mm is formed. Flow of the liquid LQ which is from between the surface of the substrate P and the upper surface 4F of the substrate stage 4, into the inside of the substrate stage 4 or into the backside of the substrate P is suppressed by setting the gap G equal to or below a predetermined value. Furthermore, the upper surface 4F of the substrate stage 4 is liquid-repellent. This also suppresses the flow of the liquid LQ into inside of the substrate stage 4 or into the backside of the substrate P via the gap G The inner side surface 4S may have liquid-repellency.

The substrate stage 4 can move in a direction of six degrees of freedom of: the X-axis, Y-axis, Z-axis, θX, θY, and θZ directions, in a condition with the substrate P held, by means of drive from a substrate stage driving device 4D which includes an actuator such as a linear motor. Position information of the substrate stage 4 (and consequently the substrate P) is measured by the laser interferometer 4L. The laser interferometer 4L measures information on the X-axis, Y-axis, and θZ directions of the substrate stage 4 by using the movement mirror 4K provided on the substrate stage 4. Furthermore, surface position information (position information related to the Z-axis, θX, and θY directions) on the surface of the substrate P held in the substrate stage 4 is detected by a focus leveling detection system (not shown in the figure). The controller 7 drives the substrate stage driving device 4D to position-control the substrate P held on the substrate stage 4 based on the measurement result of the laser interferometer 4L and the detection result of the focus leveling detection system.

The laser interferometer 4L may also be capable of measuring the position in the Z axis direction of the substrate stage 4, and the rotation information in the θX and the θY directions. More detail of this is disclosed for example in Japanese Unexamined Patent Application, First Publication No. 2001-510577 (corresponding PCT International Publication No. 1999/28790). Furthermore, instead of fixing the movement mirror 4K to the substrate stage 4, a reflection surface may be used where for example a part of the substrate stage 4 (the side face or the like) is formed by a mirror polishing process.

Furthermore, the focus leveling detection system is one which detects inclination information (rotation angle) for the θX and the θY directions of the substrate P by measuring position information for a plurality of measurement points for the Z axis direction of the substrate P. Regarding this plurality of measurement points, at least one part may be set within the liquid immersion region LR (or the projection region AR), or all of these may be set on the outside of the liquid immersion region LR. Moreover, when for example the laser interferometer 4L is capable of measuring the position information for the Z axis, the θX, and the θY directions of the substrate P, then it is possible to measure the position information for the Z axis direction during the exposure operation of the substrate P, and hence the focus leveling detection system need not be provided, and position control of the substrate P in relation to the Z axis, the θX, and the θY directions can be performed using the measurement results of the laser interferometer 4L, at least during the exposure operation.

The liquid immersion mechanism 1 fills with the liquid LQ the optical path space K between the substrate P held in the substrate stage 4 and the final optical element FL of the projection optical system PL which is provided at the position facing the substrate P and through which the exposure light EL passes. The liquid immersion mechanism 1 includes: a nozzle member 6 that is provided in the vicinity of the optical path space K and that has supply ports 12 for supplying the liquid LQ to the optical path space K and a collection port 22 for recovering the liquid LQ; a liquid supply device 11 for supplying the liquid LQ via a supply pipe 13 and the supply ports 12 of the nozzle member 6; and a liquid recovery device 21 for recovering the liquid via the collection port 22 of the nozzle member 6 and a recovery pipe 23. The nozzle member 6 is an annular member provided so as to surround at least one optical element (the final optical element FL in this embodiment) placed on the image plane side of the projection optical system PL. In this embodiment, the supply ports 12 for supplying the liquid LQ and the collection port 22 for recovering the liquid LQ is formed on the under surface 6A of the nozzle member 6. Furthermore, inside the nozzle member 6, a channel for connecting the supply ports 12 with the supply pipe 13 and a channel for connecting the collection port 22 with the recovery pipe 23 are formed. The supply ports 12 are provided at a plurality of predetermined positions on the under surface 6A of the nozzle member 6 so as to surround the final optical element FL of the projection optical system PL (optical path space K). Furthermore, the collection port 22 is provided outside the supply ports with respect to the final optical element FL on the under surface 6A of the nozzle member 6 so as to surround the final optical element FL and the supply ports 12. In this embodiment, a mesh member made of, e.g., titanium or stainless steel (e.g., SUS316), or a porous member made of a ceramic material is placed in the collection port 22.

Operations of the liquid supply device 11 and the liquid recovery device 21 are controlled by the controller 7. The liquid supply device 11 can send out the temperature-adjusted liquid LQ. The liquid recovery device 21 including a vacuum system, etc., can recover the liquid LQ. The controller 7 controls the liquid immersion mechanism 1 to perform the liquid supply operation by the liquid supply device 11 in parallel with the liquid recovery operation by the liquid recovery device 21, thereby filling the optical path space K with the liquid LQ and locally forming the liquid immersion region LR in a part on the substrate P.

The configuration of the liquid immersion mechanism 1 (the structure of the nozzle member 6, etc.) is not limited to the above, but that it may be any configuration that forms a desired liquid immersion region LR. For example, a liquid immersion mechanism disclosed in Japanese Unexamined Patent Application, First Publication No. 2004-289126 (corresponding U.S. Pat. No. 6,952,253) can be used.

Figure 2:
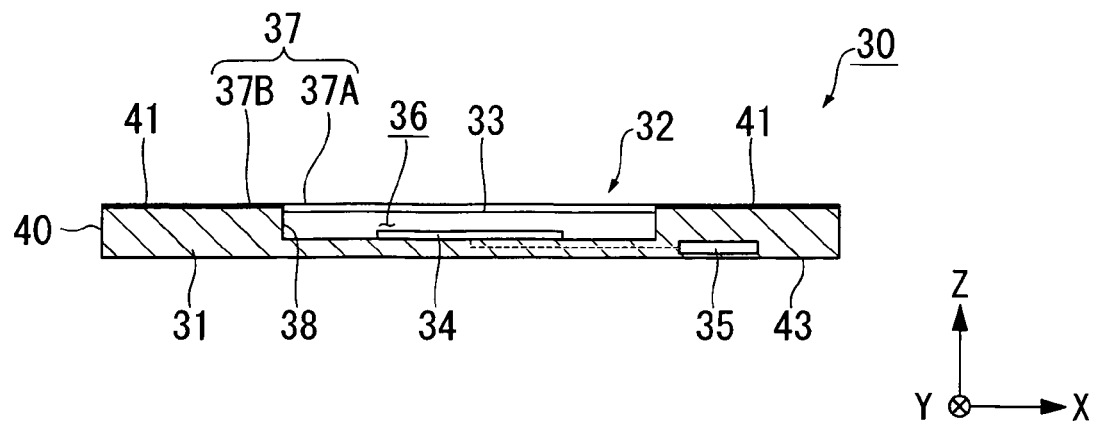
FIG. 2 is a side sectional view showing a measurement apparatus according to the first embodiment.
Figure 3:
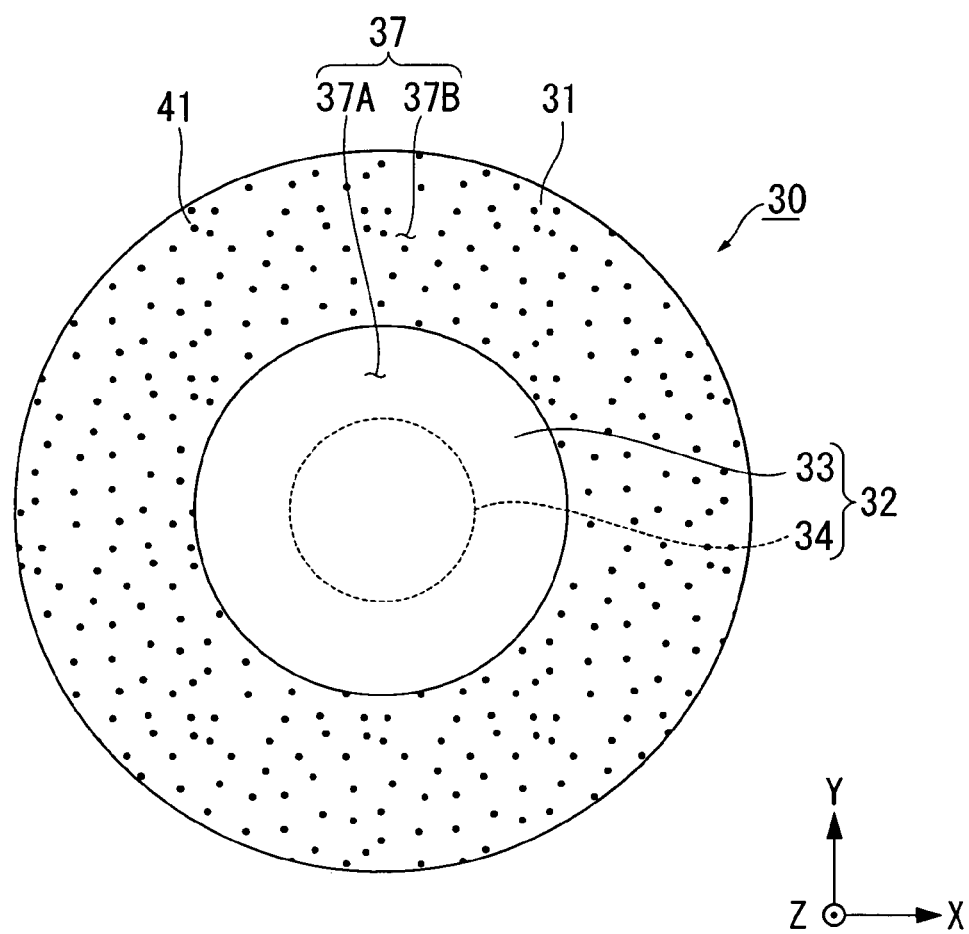
FIG. 3 is a plan view showing a measurement apparatus according to the first embodiment.

FIG. 2 is a side sectional view showing an exemplary measurement apparatus for measuring information on the exposure light EL, and FIG. 3 is a plan view showing the same. In this embodiment, a description of a measurement apparatus for measuring information on the exposure light EL will be made with reference to an illuminance sensor for measuring the illuminance of the exposure light EL by way of example In FIG. 2 and FIG. 3, an illuminance sensor 30 is for measuring information on exposure light EL via a liquid LQ, and is detachable/attachable from/to a substrate stage 4 capable of holding a substrate P. The illuminance sensor 30 of this embodiment is a substrate type sensor (wafer type sensor) having substantially the same outline as that of the substrate P, and is detachable/attachable from/to a substrate holder 4H provided on the substrate stage 4. The illuminance sensor 30 includes a base material 31 and a light receiving system 32 that is held by the base material 31 to receive the exposure light EL via the liquid LQ. The light receiving system 32 has a transmission member 33 which can transmit (pass) the exposure light EL and a light receiving device 34 for receiving the exposure light EL having transmitted through the transmission member 33. The base material 31 is formed of a predetermined material, e.g., a stainless steel.

The base material 31 has an inner space 36 which holds the transmission member 33 and in which the light receiving device 34 can be located. In a part of the upper surface 37 of the base material 31, a recess portion 38 is formed, in which the transmission member 33 is located. Placing the transmission member 33 in the recess portion 38 of the base material 31 forms an inner space 36. The transmission member is formed of, e.g., quartz, and can transmit (pass through) the exposure light EL. The upper surface 37A of the transmission member 33 held in the base material 31 and the upper surface 37B of the base material 31 holding the transmission member 33 are substantially flush with each other. In the following description, regarding the upper surface of the illuminance sensor 30, the upper surface 37A formed of the transmission member 33 will be appropriately referred to as a first surface 37A and the upper surface 37B formed of the base material 31 will be appropriately referred to as a second surface 37B. Furthermore, the upper surface of the illuminance sensor 30 in its entirety including the first surface 37A and the second surface 37B will be appropriately referred to as the upper surface 37. The second surface 37B is located around the first surface 37A and is provided so as to surround the first surface 37A.

The inner space 36 is formed between the base material 31 and the transmission member 33 held by the base material. The light receiving device 34 is located in the inner space 36. Light (exposure light EL) having transmitted through the transmission member 33 reaches the light receiving device 34. The light receiving device 34 can receive the light (the exposure light EL) having transmitted through the transmission member 33. An optical system (lens system) may be located between the transmission member 33 and the light receiving device 34.

Furthermore, when the numerical aperture NA of the projection optical system PL is large (e.g., when the numerical aperture NA is equal to or more than 1.0), the presence of a gas between the transmission member 33 and the light receiving device 34 may cause a part of the exposure light EL, i.e., the light having a large incident angle, to totally reflect from an under surface (light exit surface) of the transmission member 33. Therefore, in order to prevent the interposition of a gas between the transmission member 33 and the light receiving device 34, the transmission member 33 and the light receiving device 34 may be kept in absolute contact with each other, a liquid, etc., may be interposed that has a refractive index higher than a gas (air) with respect to the exposure light EL, or a light receiving device may be directly formed (patterned) on the under surface of the transmission member 33.

The light receiving device 34 includes, for example, a photoelectric conversion device, and outputs an electric signal corresponding to incident energy of the radiated exposure light EL. As the light receiving device 34, a photoelectric conversion device can be used that utilizes photovoltaic effect, Schottky effect, photoelectromagnetic effect, photoconductive effect, photoemission effect, pyroelectric effect, or the like.

Furthermore, the illuminance sensor 30 has a circuit device 35 connected to the light receiving device 34. The circuit device 35 is provided with a retainer connected to the light receiving device 34 for retaining a light reception result of the light received at the light receiving device 34. The circuit device 35 has an amplifier circuit (amplifier) from which a signal (illuminance signal) from the light receiving device 34 is output via a wiring, an amplification memory storage having stored an amplification rate of the amplifier circuit, a peak hold circuit for holding a peak value of the illuminance signal amplified in the amplifier circuit, and a memory device for storing a signal output from the light receiving device 34, etc.

A peripheral region of the illuminance sensor 30 has liquid-repellency to the liquid LQ (a contact angle of 90 degrees or more). In this embodiment, the second surface 37B of the illuminance sensor 30 has liquid-repellency. On the second surface 37B, a film 41 having liquid-repellency is formed, which provides the second surface 37B with liquid-repellency. The film 41 includes a fluorine-based material such as polytetrafluoroethylene (Teflon (registered trademark)) or an acryl-based material. On the other hand, a film 41 is not formed on the first surface 37A. A liquid-repellent film may be formed also on the side surface 40 of the illuminance sensor 30 (base material 31) to cause each of the second surface 37B and the side surface 40 to have liquid-repellency to the liquid LQ.

Figure 4:
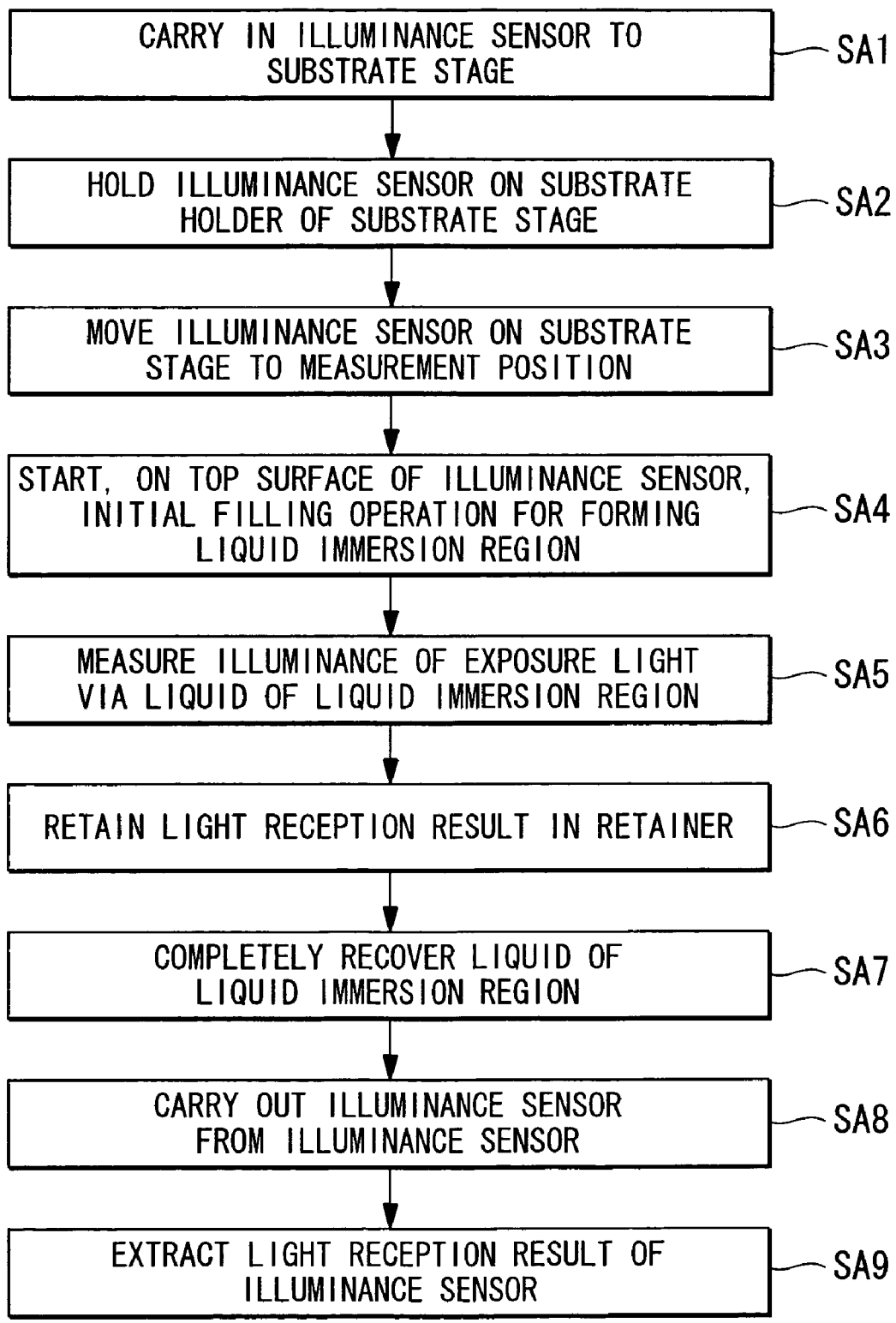
FIG. 4 is a flowchart explaining an example of a measurement procedure using the measurement apparatus.

Next, a procedure for measuring the illuminance of the exposure light EL by using the illuminance sensor 30 with the configuration above will be described referring to the flowchart in FIG. 4.

As described above, the illuminance sensor 30 has substantially the same outline as the substrate P, and the transfer apparatus 8 can transfer the illuminance sensor 30 to the substrate stage 4. To measure the illuminance of the exposure light EL by using the illuminance sensor 30, the controller 7 uses the transfer apparatus 8 to carry in (load) the illuminance sensor 30 to a substrate holder 4H of the substrate stage S (STEP SA1). The controller 7 controls the substrate holder to hold the illuminance sensor 30 carried in by the transfer apparatus 8. The substrate holder 4H holds the under surface 43 of the illuminance sensor 30 (STEP SA2).

Figure 5:
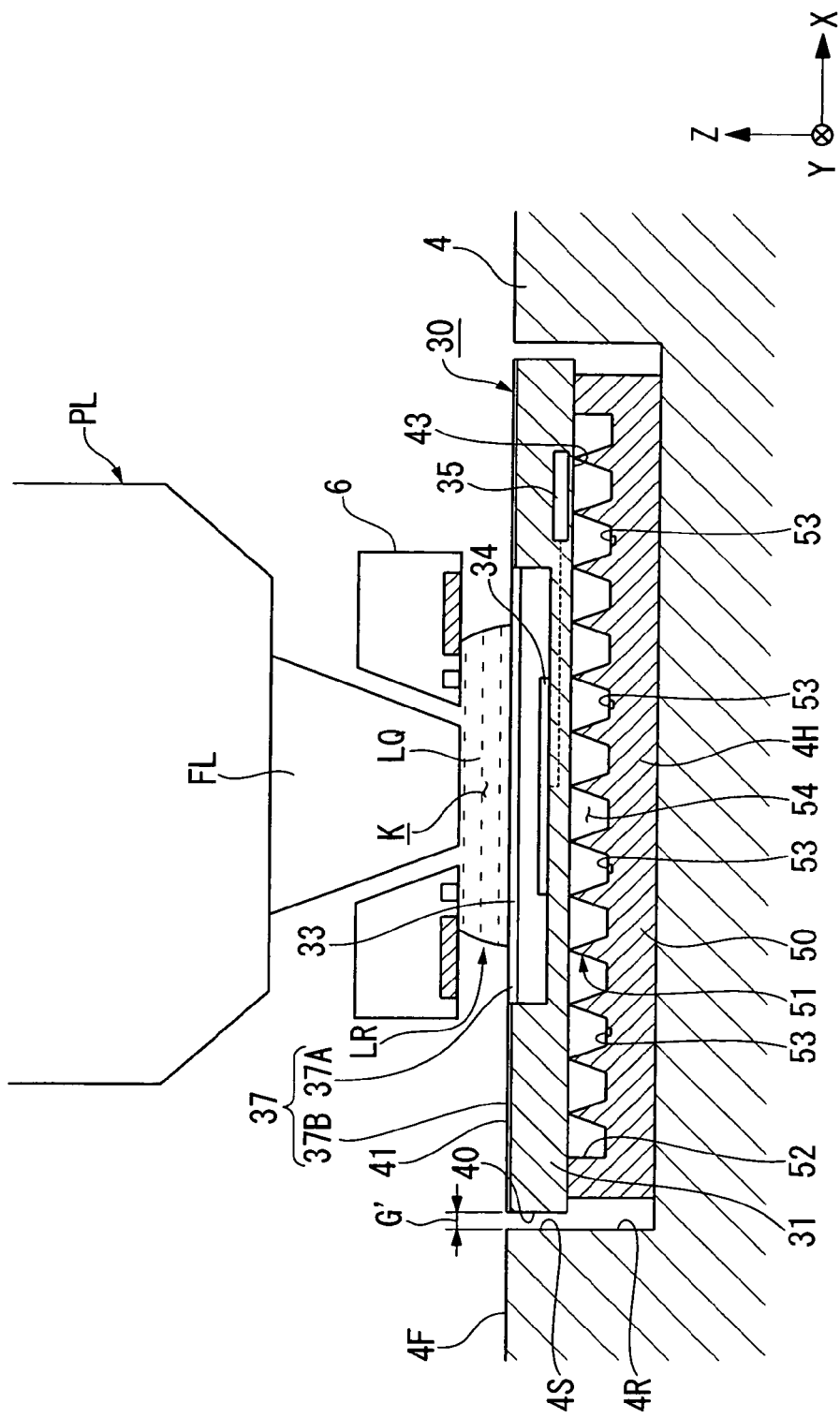
FIG. 5 is a schematic showing an example of measurement operation using the measurement apparatus.

FIG. 5 shows the illuminance sensor 30 held by the substrate holder 4H. The substrate holder 4H of this embodiment includes a base material 50, a plurality of supporting portions 51 formed of a pin-like member are provided on the upper surface of the base material 50 for supporting the under surface 43 of the illuminance sensor 30, and a peripheral wall (rim) 52 that has an upper surface facing the under surface 43 of the illuminance sensor 30 and that is provided so as to surround the supporting portions 51. Furthermore, on the upper surface of the base material 50 are provided gas-suction ports 53 connected to a vacuum system, not shown in figures. The controller 7 drives the vacuum system which sucks the gas in spaces 54 formed with the base material 50, the peripheral wall 52, and the under surface 43 of the illuminance sensor 30 supported by the supporting portions 51 via the gas-suction ports 53 to apply a negative pressure to the spaces 54, thus allowing the under surface 43 of the illuminance sensor 30 to be suck-and-held by the supporting portions 51. That is to say, the substrate holder 4H of this embodiment is provided with a so-called pin chuck structure, and therefore can suck-and-hold each of the illuminance sensor 30 and the substrate P. Furthermore, the controller 7 can detach the illuminance sensor 30 (substrate P) from the substrate holder 4H by stopping the suction operation via the gas-suction ports 53. Thus, the substrate holder 4H provided in the substrate stage 4 can detachably hold each of the illuminance sensor 30 and the substrate P.

An upper surface 4F of the substrate stage 4 is located around the upper surface 37 (second surface 37B) of the illuminance sensor 30 held by the substrate holder 4H. The upper surface 37 (second surface 37B) of the illuminance sensor 30 is substantially flush with the upper surface 4F of the substrate stage 4. Furthermore, an inner side surface 4S of the recess portion 4R of the substrate stage 4 is provided at a position facing the side surface 40 of the illuminance sensor 30 held by the substrate holder 4H. A predetermined gap G' is formed between the side surface 40 of the illuminance sensor 30 and the inner side surface 4S of the substrate stage 4. Since the illuminance sensor 30 has substantially the same outline as the substrate P, the gap G' formed between the side surface 40 of the illuminance sensor 30 held by the substrate holder 4H and the inner side surface 4S of the substrate stage 4 and the gap G formed between a side surface of the substrate P held by the substrate holder 4H and the inner side surface 4S of the substrate stage 4 are substantially the same (approximately 0.1 to 1 mm). Thus, the penetration of the liquid LQ from between the upper surface 37 of the illuminance sensor 30 and the upper surface 4F of the substrate stage 4 into the inside of the substrate stage 4 or into the under surface 43 side of the illuminance sensor 30 is suppressed. Furthermore, since the upper surface 4F of the substrate stage 4 and the second surface 37B, the peripheral region of the upper surface 37 of the illuminance sensor 30 are liquid-repellent, the penetration of the liquid LQ into the inside of the substrate stage 4 and into the under surface 43 side of the illuminance sensor 30 is suppressed. The penetration of the liquid LQ can be more securely prevented if the inner side surface 4S and/or the side surface 40 have/has liquid-repellency.

After the illuminance sensor 30 is held by the substrate holder 4H, the controller 7 controls the substrate stage 4 to move the illuminance sensor 30 held by the substrate holder of the substrate stage 4 to a measurement position (STEP SA3). That is, the controller 7 moves the substrate stage 4 such that the final optical element FL of the projection optical system PL and the first surface 37A, the upper surface of the transmission member 33 of the illuminance sensor 30 held by the substrate holder 4H faces each other. With the final optical element FL of the projection optical system PL and the first surface 37A of the illuminance sensor 30 held by the substrate holder 4H facing each other, the controller 7 starts to form a liquid immersion region LR of the liquid LQ on the first surface 37A of the illuminance sensor 30 by using the liquid immersion mechanism 1. That is, at the upper surface 37 (first surface 37A) of the illuminance sensor 30, the liquid immersion mechanism 1 starts the supply operation of the liquid LQ from the supply ports 12 for forming the liquid immersion region LR (STEP SA4). In the following description, an operation of supplying the liquid LQ to the optical path space K in its initial state where no liquid LQ is present (in an empty state), so as to fill the optical path space K with the liquid LQ, will be appropriately referred to as an initial filling operation. That is, an initial filling operation refers to an operation of forming a liquid immersion region LR on the upper surface 37 by supplying the liquid LQ to the upper surface 37 without the liquid LQ.

When starting the initial filling operation, the controller 7 brings the substrate stage 4 to a substantially stationary state. That is, when starting an initial filling operation for forming a liquid immersion region LR by using the liquid immersion mechanism 1, the controller 7 keeps a relative position between the final optical element FL of the projection optical system PL and the illuminance sensor 30 held by the substrate holder 4H. The controller 7 forms the liquid immersion region LR of the liquid LQ on the first surface 37A of the illuminance sensor 30 as is shown in FIG. 5 by performing in parallel the supply operation and recovery operation of the liquid LQ by the liquid immersion mechanism 1, with the substrate stage 4 in a substantially stationary state.

Then, the controller 7 controls the illumination optical system IL to emits exposure light EL to the liquid immersion region LR being formed on the first surface 37A of the illuminance sensor 30 held by the substrate holder 4H of the substrate stage 4. The exposure light EL is shone onto the illuminance sensor 30 held by the substrate holder 4H via the projection optical system PL and the liquid LQ. The illuminance sensor 30 receives the exposure light EL with the light receiving system 32 via the liquid LQ while being held by the substrate holder 4H of the substrate stage 4. The illuminance sensor 30 measures information on the illuminance of the exposure light EL by receiving the exposure light EL via the liquid LQ (STEP SA5). A light reception result of the light received at the light receiving device 34 of the light receiving system 32 is retained (stored) in the circuit device 35 (STEP SA6).

When measuring the illuminance of the exposure light EL with the illuminance sensor 30, the controller 7 adjusts the positional relationship between the light receiving surface (first surface 37A) of the illuminance sensor 30 and the image plane formed via the projection optical system PL and the liquid LQ such that they substantially match. Furthermore, when measuring the illuminance of the exposure light EL with the illuminance sensor 30, the controller 7 performs the supply operation and recovery operation of the liquid LQ by the liquid immersion mechanism 1 in parallel. By this, the liquid immersion region LR of clean and temperature-adjusted liquid LQ can be formed and the illuminance sensor 30 can receive the exposure light EL at the light receiving device 34 via the clean and temperature-adjusted liquid LQ. Furthermore, while the illuminance sensor 30 is measuring the illuminance of the exposure light EL, the controller 7 keeps the substrate stage 4 substantially stationary, maintaining the relative position of the final optical element FL of the projection optical system PL and the illuminance sensor 30 held by the substrate holder 4H, by extension, the relative position between the liquid immersion region LR and the transmission member 33.

The size of the first surface 37A of the transmission member 33 is larger enough than the size of the liquid immersion region LR, and thus the liquid immersion region LR can be smoothly formed inside the first surface 37A of the transmission member 33. The transmission member 33 having the first surface 37A which is larger than the liquid immersion region LR can be provided on the illuminance sensor 30 by acquiring the size of the liquid immersion region LR to be formed in advance by experiment or simulation. The liquid immersion region LR smaller than the first surface 37A of the transmission member 33 may be formed by appropriately adjusting the liquid supply operation and/or liquid recovery operation by the liquid immersion mechanism 1 or appropriately adjusting the form of the nozzle member 6.

In this embodiment, the transmission member 33 (the upper surface 37A) has a substantially circular outline as shown in FIG. 3, but it may have another outline in accordance with the shape and/or the size of the liquid immersion region LR.

In this embodiment, a liquid-repellent film 41 is formed on the second surface 37B of the base material 31 located around the first surface 37A of the transmission member 33. Therefore, flowing out of the liquid LQ of the liquid immersion region LR formed on the first surface 37A of the transmission member 33 to the outside the first surface 37A is suppressed.

Furthermore, the liquid-repellent film 41 is not formed on the first surface 37A of the transmission member 33 on which the liquid immersion region LR of the liquid LQ is formed. This, therefore, can suppress the deterioration of measurement accuracy. In other words, the liquid-repellent film 41 can be subject to deterioration by the irradiation of the exposure light EL. If the liquid-repellent film 41 is formed on the first surface 37A of the transmission member 33 onto which the exposure light EL is shone, the irradiation of the exposure light EL may change the state of the liquid-repellent film 41 because the film 41 may be subject to deterioration by the irradiation of the exposure light EL. When the state of the film 41 changes, the light receiving state of the light receiving device 34 may be subject to change including the change in the illuminance (light amount) of the exposure light reaching the light receiving device 34. Furthermore, when the surface of the film 41 becomes rough due to the irradiation of the exposure light EL, the exposure light EL shone onto the film 41 may be scattered. When these situations arise, deterioration of measurement accuracy of the illuminance sensor 30 may be brought about. In this embodiment, the liquid immersion region LR is formed and the film 41 is not formed on the first surface 37A of the transmission member 33 irradiated with the exposure light EL, thus suppressing the occurrence of the disadvantages mentioned above.

Furthermore, although the film 41 is not formed on the first surface 37A of the transmission member 33, the liquid immersion region LR is smaller than the first surface 37A of the transmission member 33 of the illuminance sensor 30. Besides, while the liquid immersion region LR of the liquid LQ is formed on the first surface 37A of the transmission member 33, the relative position between the liquid immersion region LR and the first surface 37A of the transmission member 33 is maintained (since the substrate stage 4 is substantially stationary). Therefore, flowing out of the liquid LQ of the liquid immersion region LR from the first surface 37A of the illumination sensor 30 is suppressed.

After completion of the measurement using the illuminance sensor 30, the controller 7 removes the liquid immersion region LR from the upper surface 37 of the illuminance sensor 30. When removing the liquid immersion region LR from the upper surface 37 of the illuminance sensor 30, the controller 7 stops the liquid supply operation via the supply ports 12 and continues to perform the liquid recovery operation for a predetermined period of time. Through this, all of the liquid LQ in the liquid immersion region LR can be recovered (removed) (STEP SA7). In the following description, the operation of recovering all of the liquid LQ that fills the optical path space K (the liquid LQ in the liquid immersion region LR) is appropriately referred to as the "complete recovery operation."

A thin film or microscopic droplets of the liquid LQ may remain on the first surface 37A after performing the complete recovery operation since the first surface 37A does not have liquid-repellency, but the controller 7 determines that the complete recovery operation by the liquid immersion mechanism 1 is complete when the recovery amount of the liquid LQ from the collection port 22 of the nozzle member 6 reaches a predetermined amount or below (substantially zero).

After complete-recovering the liquid LQ in the liquid immersion region LR, the controller 7 uses the transfer apparatus 8 to carry out (unload) the illuminance sensor 30 from the substrate stage 4 (STEP SA8).

The illuminance sensor 30 unloaded from the substrate stage 4 has the stored information retained in the retainer (memory storage) 35 extracted (read) by an analyzer located at a predetermined position (STEP SA9).

Figure 6:
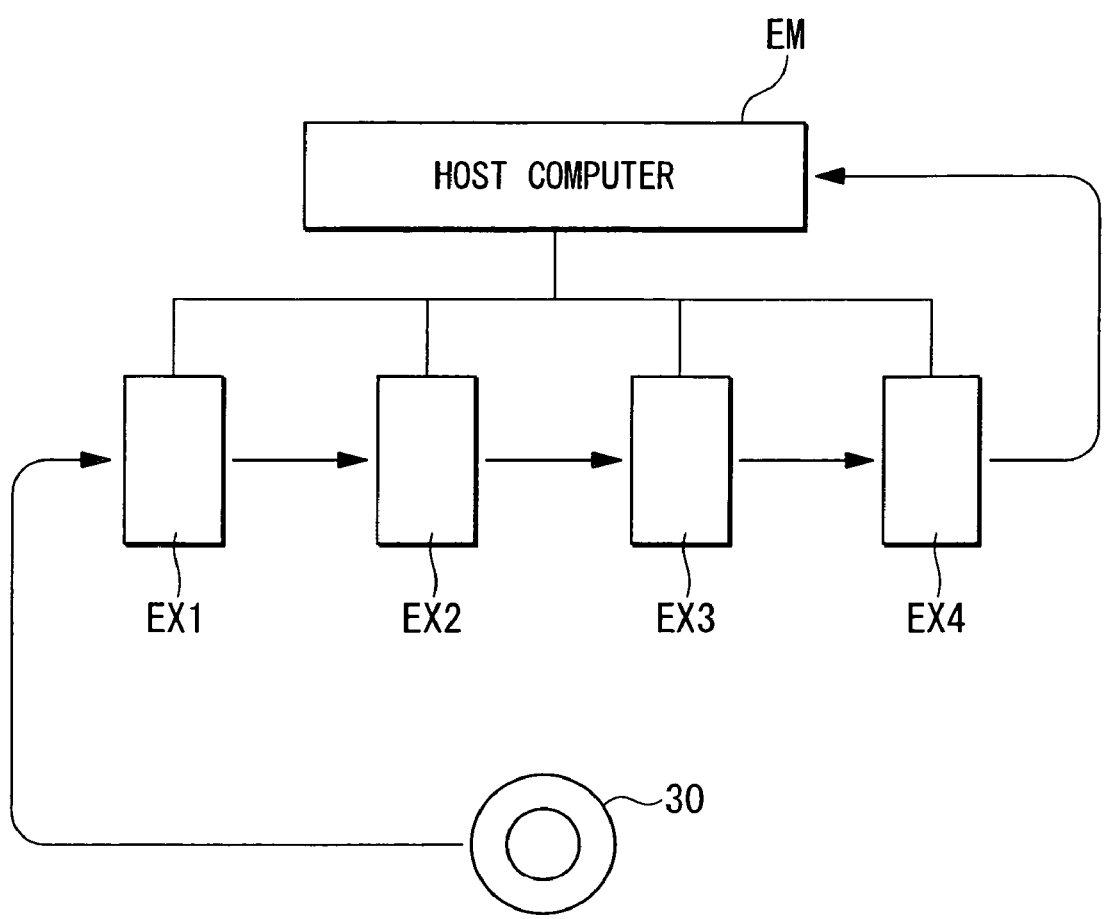
FIG. 6 is a schematic showing an example of measurement operation using the measurement apparatus.

In the manufacturing system of the micro devices (semiconductor devices) of this embodiment, a plurality of liquid immersion exposure apparatuses EX1 to EX4 are simultaneously used as shown in the schematic of FIG. 6. These exposure apparatuses EX1 to EX4 are connected to the same host computer EM. Thus, their respective operational status and the like are monitored to manage the manufacture. Illuminance of each of these exposure apparatuses EX1 to EX4 is measured by the illuminance sensor 30 serving as a reference illuminometer, and is used for matching exposure amounts among the exposure apparatuses, etc. Thus, the stored information retained in the circuit device 35 of the illuminance sensor 30 is extracted by an analyzer connected to the host computer EM.

In the schematic of FIG. 6, the illuminance sensor 30 may retain measurement data together with information indicating which exposure apparatus is the source of the measurement data, since measurement results are extracted by an analyzer connected to the host computer EM after completion of measurement in each of the exposure apparatuses EX1 to EX4.

Furthermore, in the schematic of FIG. 6, measurement results of the exposure apparatuses EX1 to EX4 are extracted by the analyzer connected to the host computer EM after completion of measurement in the exposure apparatuses. However, a measurement result retained in the illuminance sensor 30 may be extracted by an analyzer located in a predetermined position and sent out to the host computer EM every time one exposure apparatus finishes measuring. In this case, information indicating which exposure apparatus is the source of the measurement data may be additionally sent out when the measurement data is sent out from the analyzer to the host computer EM.

Furthermore, the illuminance sensor 30 may wirelessly transmit the measurement data to the controller 7. The controller 7 in turn may correlate the measurement data with the identification information of the exposure apparatus (e.g., the serial number) to send it out to the host computer EM. Although the manufacturing system of FIG. 6 is described as provided with four liquid immersion exposure apparatuses EX1 to EX4, the number and the type of exposure apparatuses are not limited to the above. For example, a normal type exposure apparatus, not an immersion type, may be included.

Furthermore, transfer of the illuminance sensor 30 between two exposure apparatuses may be performed with the transfer system for transferring the substrate P or by an operator.

Furthermore, a permanently-provided illuminance sensor (not shown) is provided on the substrate stage 4 of each of the exposure apparatuses EX1 to EX4. The illuminance matching that of other exposure apparatuses can be derived from the measurement result by the permanently-provided illuminance sensor by correcting the measurement result by the permanently-provided illuminance sensor with the measurement result by the detachable/attachable illuminance sensor 30.

As described above, the illuminance sensor 30 detachable/attachable from/to the substrate stage 4 allows smooth measurement of information on illuminance among respective exposure apparatuses via the liquid LQ. Moreover, the transfer apparatus 8 can be used to smoothly transfer the illuminance sensor 30 to the substrate stage 4. The projection optical system PL and various precision devices (members) are located in the vicinity of the substrate stage 4. Therefore, for example, in the case of a configuration in which the illuminance sensor 30 is detached/attached from/to the substrate stage 4 manually by a worker, disadvantages occur such as difficulty of smooth work, damaging precision devices, etc., and causing environment (purity, temperature, humidity, etc.) in which the exposure apparatus is set. In this embodiment, the illuminance sensor 30 has substantially the same outline as the substrate P, and the transfer apparatus 8 for loading/unloading the substrate P to/from the substrate holder 4H is used to detach/attach the illuminance sensor 30 from/to the substrate sensor 30. Thus, the illuminance sensor 30 can be smoothly detached/attached from/to the substrate stage 4. Furthermore, availability of the exposure apparatus EX can be increased because interruption in exposure processing involved in illuminance measurement can be decreased.

Furthermore, since the illuminance sensor 30 has substantially the same outline as the substrate P and is detachable/attachable from/to the substrate holder 4H, the liquid immersion region LR can be formed on the upper surface 37 of the illuminance sensor 30 with substantially the same condition (operation) as when the liquid immersion region LR is formed on the substrate P and information on illuminance can be measured.

Furthermore, the film 41 is not formed on the first surface 37A on which the liquid immersion region LR is formed on the transmission member 33, but the film 41 is formed on the second surface 37B located around the first surface 37A. Therefore, flowing out of the liquid LQ can be suppressed and the measurement accuracy of the illuminance sensor 30 can be maintained.

Furthermore, in this embodiment, the initial filling operation is started on the upper surface 37 (first surface 37) of the illuminance sensor 30, and the liquid immersion region LR is formed on the first surface 37A even while the illuminance sensor 30 is measuring the exposure light EL. More specifically, the liquid immersion region LR is always formed on the first surface 37A during the measurement operation with the illuminance sensor 30. Thus, even if there is a gap between the transmission member 33 and the base material 31, penetration of the liquid LQ into the inner space 36 through the gap can be suppressed.

Furthermore, the liquid immersion region LR is not formed in the gap G' between the upper surface 37 of the illuminance sensor 30 and the upper surface 4F of the substrate stage 4. Therefore, penetration of the liquid LQ via the gap G' into the inside of the substrate stage 4 can be prevented. Furthermore, the second surface 37B of the illuminance sensor 30 and the upper surface 4F of the substrate stage 4 are substantially flush with each other, and besides, the second surface 37B and the upper surface 4F of the substrate stage 4 located around the second surface 37B are liquid-repellent. Therefore, even if the liquid immersion region LR is formed so as to bridge the gap G', disadvantages including flowing out of the liquid LQ can be suppressed.

The initial filling operation may not be started in the upper surface 37 of the illuminance sensor 30. In that case, the initial filling operation is started in the upper surface of another object, e.g., in the upper surface 4F of the substrate stage 4 to form the liquid immersion region LR on the upper surface 4F. Then, while the supply operation and recovery operation of the liquid LQ is continuously performed by the liquid immersion mechanism 1, the substrate stage 4 is moved along the XY-plane such that the liquid immersion region LR formed on the upper surface 4F of the substrate stage 4 is moved to the upper surface 37 of the illuminance sensor 30. The gap G' is microscopic, and the upper surface 4F of the substrate stage 4 and the upper surface 37 (second surface 37B) of the illuminance sensor 30 is liquid-repellent. Therefore, flowing out or penetration of the liquid LQ can be prevented. Furthermore, also when the liquid immersion region LR is moved between the second surface 37B of the illuminance sensor 30 and the upper surface 4F of the substrate stage 4, the liquid immersion region LR can be moved smoothly with flow out of the liquid LQ being suppressed. Another object may be a measurement stage, etc. that is movable independent of the substrate stage 4.

Furthermore, in this embodiment, the complete recovery operation of the liquid LQ in the liquid immersion region LR formed on the upper surface 37 of the illuminance sensor 30 is performed after completion of the measurement operation by the illuminance sensor 30, but instead of performing the complete recovery operation of the liquid LQ, the liquid immersion region LR may be moved from the upper surface 37 of the illuminance sensor 30 to, e.g., the upper surface 4F of the substrate stage 4 or to the upper surface of an object other than the substrate stage 4 by moving the substrate stage 4 along the XY-direction while the supply operation and recovery operation of the liquid LQ by the liquid immersion mechanism 1 is being performed.

In this embodiment, the light receiving device 34 and the circuit device 35 are integrally provided into the base material 31, but the light receiving device 34 may be provided in the base material 31 and the circuit device 35 may be provided on the outside of the base material 31. Moreover, the light receiving device 34 and the circuit device 35 may be connected with, e.g., a flexible connection cable. Alternatively, wireless transmission may be carried out between the light receiving device 34 and the circuit device 35.

Second Embodiment

A second embodiment will now be described with reference to FIG. 7. Components the same as or similar to those of the abovementioned embodiment are denoted by the same reference symbols, and description thereof is simplified or omitted.

Figure 7:
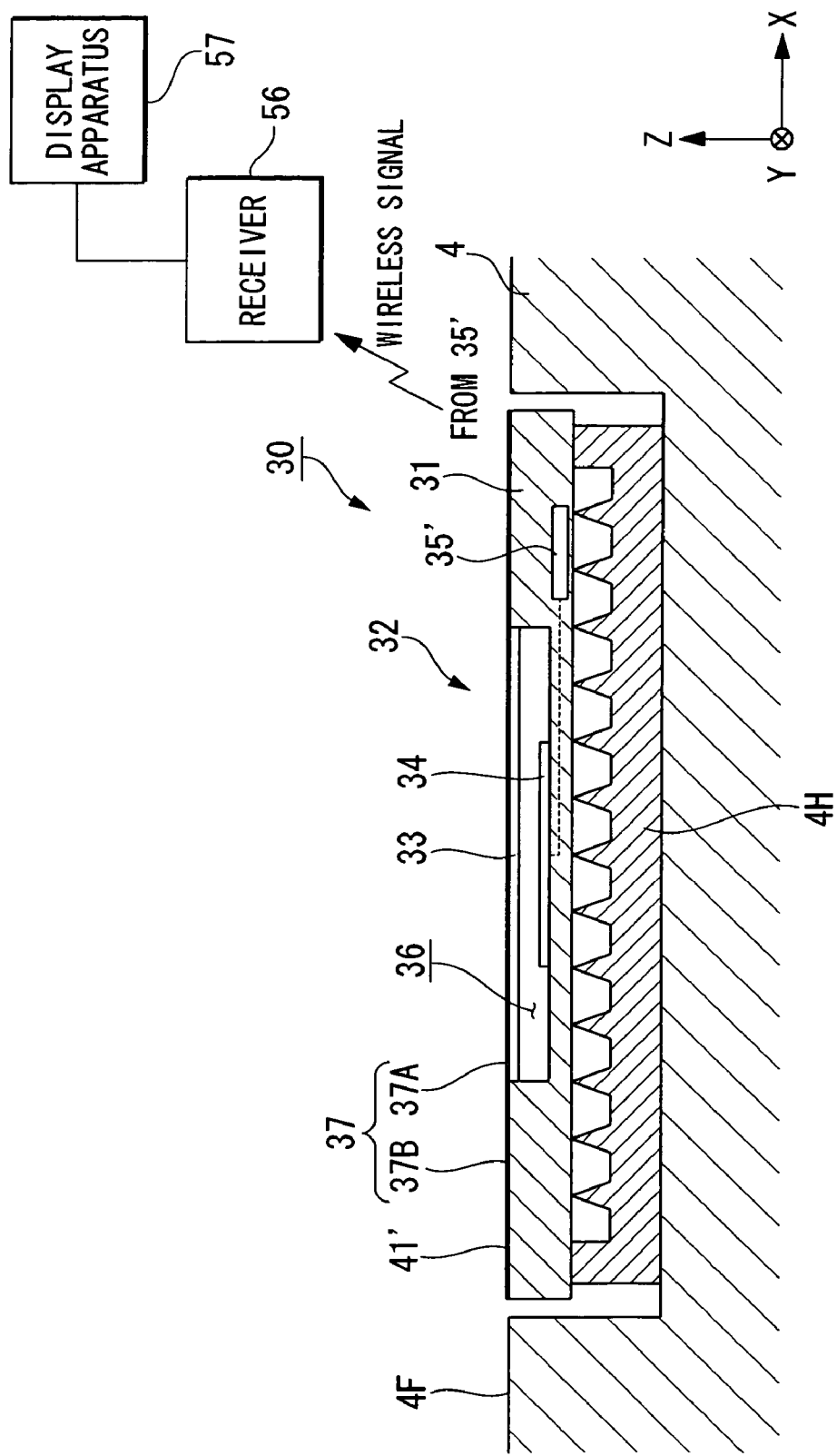
FIG. 7 is a side sectional view showing a measurement apparatus according to a second embodiment.

In FIG. 7, an illuminance sensor 30 includes: a base material 31; a transmission member 33 held by the base material 31; a light receiving device 34 located in an inner space 36; and a circuit device 35' connected to the light receiving device 34. The circuit device 35' of this embodiment is connected to the light receiving device 34 and includes a transmitter for wirelessly transmit a light reception result of the light received at the light receiving device 34. Furthermore, an exposure apparatus EX includes a receiver 56 for receiving a wireless signal including the measurement result transmitted from the circuit device (transmitter) 35' of the illuminance sensor 30. The illuminance sensor 30 of this embodiment also has substantially the same outline as a substrate P and is detachable/attachable from/to a substrate holder 4H. Furthermore, in this embodiment, the measurement result received by the receiver 56 is adapted to be displayed on a display apparatus 57.

Furthermore, in this embodiment, a film 41' is formed on the entirety of an upper surface 37 including a first surface 37A and a second surface 37B of the illuminance sensor 30. The film 41' is formed of a material having liquid-repellency, high transmittance with respect to the exposure light EL, and resistance to the exposure light EL (ultraviolet light). In this embodiment, the film 41' is formed of "CYTOP" manufactured by ASAHI GLASS CO., LTD.

As described above, the light reception result of light reception at the light receiving device 34 can be wirelessly transmitted. This can omit cables, etc. for transmitting, e.g., the light reception result. Furthermore, by providing the film 41' formed of CYTOP, etc., as in this embodiment, the upper surface 37 of the illuminance sensor 30 can be liquid-repellent, thus preventing flow out or remaining of the liquid LQ.

Third Embodiment

Figure 8:
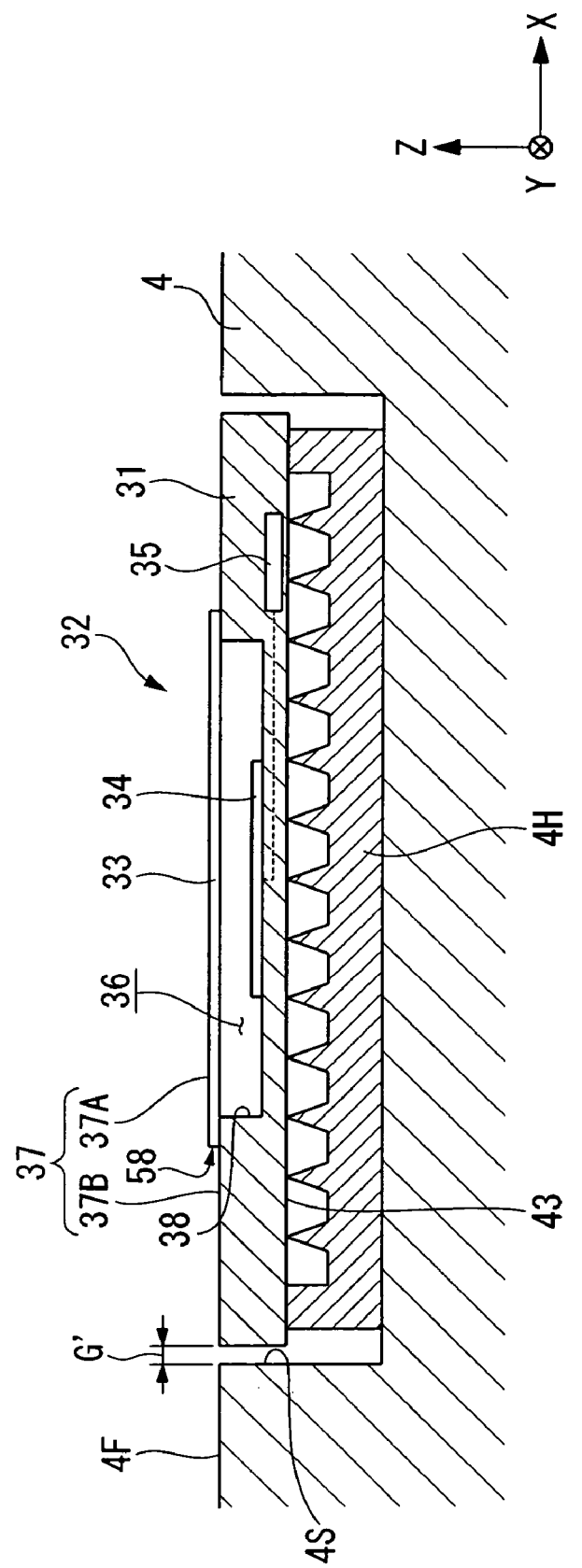
FIG. 8 is a side sectional view showing a measurement apparatus according to a third embodiment.

A third embodiment will now be described with reference to FIG. 8. In the following description, components the same as or similar to those of the abovementioned embodiment are denoted by the same reference symbols, and description thereof is simplified or omitted. In FIG. 8, a height difference 58 is provided between a first surface 37A of a transmission member 33 and a second surface 37B of a base material 31. The size (diameter) of the transmission member 33 is formed larger than the size (diameter) of a recess portion 38 of the base material 31, and a peripheral region of the under surface of the transmission member 33 is held by a part of the upper surface 37B of the base material 31. Furthermore, in this embodiment, the base material 31 is formed of a material having liquid-repellency (such as fluoroplastic). Therefore, liquid-repellency of the second surface 37B can be maintained without a liquid-repellent film. The second surface 37B, the peripheral region of the upper surface 37 of the illuminance sensor 30 held by a substrate holder 4H and an upper surface 4F of the substrate stage 4 located around it are substantially flush with each other.

Even though the height difference 58 is formed between the first surface 37A and the second surface 37B as described above, remaining of the liquid LQ in the height difference 58 is prevented if the initial filling operation and the complete recovery operation are performed on the first surface 37A as in the embodiments described above. Furthermore, as is shown in FIG. 8, since the transmission member 33 is provided on a part of the upper surface 37B of the base material 31 so as to be put on the part, an inner space 36 can be larger. Therefore, freedom of design of the illuminance sensor 30 can be increased. Furthermore, the second surface 37B of the illuminance sensor 30 held by the substrate holder 4H and the upper surface 4F of the substrate stage 4 are substantially flush with each other. Therefore, penetration of the liquid LQ into the inside of the substrate stage 4 or the under surface 43 side of the illuminance sensor 30 via the gap G' can be prevented. Furthermore, the height difference 58 is small (e.g., equal to or less than 2 mm). Therefore, even when the liquid immersion region LR formed on another object is moved between the second surface 37B of the illuminance sensor 30 and the upper surface 4F of the substrate stage 4 so as to be moved to the first surface 37A, the liquid immersion region LR can be moved smoothly with flowing out of the liquid LQ being suppressed.

Since the entirety of the first surface 37A of the transmission member 33 need not be able to transmit the exposure light EL in above-described embodiments, the first surface 37A of the transmission member 33 may be coated with a material that does not transmit the exposure light EL while an aperture (opening) for passing the exposure light EL is formed in a part thereof. In this case, the first surface 37A of the transmission member 33 may be coated with a liquid-repellent material that can transmit the exposure light EL. Alternatively, in the first surface 37A of the transmission member 33, a liquid-repellent film may be formed only on the surface of the region coated with a material that does not transmit the exposure light EL without forming a liquid-repellant film on the region of the surface where an aperture (opening) for passing the exposure light EL is formed.

In the above-described embodiment, the second surface 37B of the illuminance sensor 30 is described as flush with (at the same height as) the upper surface 4F of the substrate stage 4, but the configuration is not limited thereto. There may be a difference in height between the second surface 37B of the illuminance sensor 30 and the upper surface 4F of the substrate stage 4. For example, when there is a thickness difference between the illuminance sensor 30 and the substrate P, there will be a height difference between the upper surface 37 of the illuminance sensor 30 and the upper surface 4F of the substrate stage 4 if the illuminance sensor 30 is held by the substrate holder 4H. When the gab between the upper surface 37 of the illuminance sensor 30 and the upper surface 4F of the substrate stage 4 is extremely large, the substrate holder, for example, may be adapted to be slightly movable in the Z-axis direction to make the gap smaller, or even to be zero.

Furthermore, although the supporting portions 51 of the substrate holder 4H are described as substantially at the same height as the peripheral wall 52 in each of the above-described embodiments, the configuration is not limited thereto. For example, the peripheral wall 52 may be slightly lower than the supporting portions 51. In this case, pins whose tips are located on the same plane as the supporting portions 51 (a plurality of pin-like members) may be provided on the top end surface of the peripheral wall 52. Furthermore, although the substrate holder 4H is described as having the plurality of pin-like members surrounded by a peripheral wall 52, the configuration is not limited thereto. For example, a loading surface of the substrate holder 4H may be divided into a plurality of blocks, and in each of the blocks a plurality of pin-like members may be surrounded by a peripheral wall. Furthermore, although the substrate holder is described as a pin chuck type, the type is not limited thereto. For example, the substrate holder 4H may be a holder having a plurality of concentric protrusions, etc. Although not shown in each of the above-described embodiments, for example, a pin member capable of moving in the Z-axis direction via a through-hole of the substrate holder 4H is provided to the substrate stage 4. The substrate P and the illuminance sensor 30 are adapted to be transferred by this pin member between the transfer apparatus 8 and the substrate stage 4.

In each of the above-described embodiments, the illuminance sensor 30 is detachably provided to the substrate holder 4H of the substrate stage 4, but for example, a dedicated attachment region is provided on the upper surface 4F of the substrate state 4 in the vicinity of the substrate holder 4H, etc., and the illuminance sensor 30 may be detachably provided to the attachment region. In this case, as long as the illuminance sensor 30 can be transferred by e.g., the transfer apparatus 8, the illuminance sensor 30 need not have the same size, outline, etc., as the substrate P.

In each of the above-described embodiments, the outline of the illuminance sensor 30 is a substantially circular plate-shape, which is the same as that of the substrate P (wafer), but in an exposure apparatus for manufacturing liquid crystal display devices, for example, the outline may be formed into substantially the same shape as that of the glass substrate, the exposure target, i.e., into rectangular plate-shape.

In each of the above-described embodiments, the illuminance sensor 30 has substantially the same outline as the substrate (wafer), but it may have a shape different from that of the substrate (wafer) as long as it is detachable/attachable from/to the substrate stage 4 (substrate holder 4H) and can measure information on the exposure light EL. Similarly, the illuminance sensor 30 may have a size different from that of the substrate (wafer).

As the illuminance sensor 30, a light receiving device (light receiving device) may be formed in the semiconductor wafer by, e.g., the photolithography technique. Furthermore, a light receiving device may be detachably provided to the semiconductor wafer.

In each of the above-described embodiments, the description has been made referring to, as a measurement apparatus for measuring information on the exposure light EL, the illuminance sensor for measuring the illuminance of the exposure light EL by way of example. However, as a measurement apparatus for measuring information on the exposure light EL, any configuration may be adopted including an illuminance non-uniformity sensor for measuring illuminance non-uniformity of the exposure light EL and an aerial image measurement sensor for measuring space image (projection image).

In the abovementioned embodiments, respective position information for the mask stage 3 and the substrate stage 4 is measured using an interference system (3L, 4L). However the invention is not limited to this and for example, an encoder system which detects a scale (grating) provided in each stage may be used. In this case, preferably a hybrid system is furnished with both of an interference system and an encoder system, and calibration of the measurement results of the encoder system is performed using the measurement results of the interference system. Moreover, position control of the stage may be performed using the interference system and the encoder system interchangeably, or using both.

As described above, in the above embodiments, pure water (extra pure water) is used as the liquid LQ. Pure water has advantages in that it can be easily obtained in large quantity at semiconductor manufacturing plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned.

In addition, the index of refraction n of pure water (water) with respect to exposure light EL with a wavelength of 193 nm is nearly 1.44, so in the case where ArF excimer laser light (193 nm wavelength) is used as the light source of the exposure light EL, it is possible to shorten the wavelength to 1/n, that is, approximately 134 nm on the substrate P, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In the above embodiments, an optical element FL is attached to the tip end of the projection optical system PL, and this optical element FL can be used to adjust the optical characteristics, for example, the aberration (spherical aberration, coma aberration, etc.), of the projection optical system PL. Note that an optical plate used for the adjustment of the optical characteristics of the projection optical system PL may also be used as the optical element attached to the tip end of the projection optical system PL. Or, it may also be a plane-parallel plate (cover glass or the like) through which the exposure light EL is able to pass.

In the case where the pressure between the substrate P and the optical element of the front end of the projection optical system PL arising from the flow of the liquid LQ is large, it is permissible to make that optical element not one that is replaceable but one that is firmly secured so that the optical element does not move due to that pressure.

In the above embodiments, the configuration is one in which a liquid LQ is filled between the projection optical system PL and the surface of the substrate P, but it may also be a configuration in which the liquid LQ is filled in a status in which a cover glass consisting of a plane-parallel plate is attached to the surface of the substrate P, for example.

Furthermore, in the projection optical system of the above embodiment, the optical path space on the image plane side of the optical element at the front end is filled with a liquid, but a projection optical system, as disclosed in PCT International Publication No. WO 2004/019128, in which the optical path space on the object plane side of the optical element at the front end is also filled with a liquid, may be adopted.

Note that the liquid LQ of the embodiments is water, but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In this case, the part to be in contact with liquid LQ is applied with lyophilic treatment by forming a thin film using a substance with a molecular structure that has a small polarity including fluorine. In addition, it is also possible to use, as the liquid LQ, liquids that have the transmittance with respect to the exposure light EL and whose refractive index are as high as possible and that are stable with respect to the photoresist coated on the projection optical system PL and the surface of the substrate P (for example, cedar oil).

Moreover as the liquid LQ, a liquid with a refractive index of 1.6 to 1.8 may be used. Furthermore, the optical element FL may be formed from a quartz, or a material with a higher refractive index than that of quartz (for example, above 1.6). For the liquid LQ, various liquids, for example a supercritical liquid, can be used.

It is to be noted that as for substrate P of each of the above-described embodiments, not only a semiconductor wafer for manufacturing a semiconductor device, but also a glass substrate for a display device, a ceramic wafer for a thin film magnetic head, or a master mask or reticle (synthetic quartz or silicon wafer), etc. can be used.

As for exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Moreover, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As the stitch type exposure apparatus, a step-and-stitch type exposure apparatus in which at least two patterns are transferred onto the substrate P in a partially overlapping manner, and the substrate P is sequentially moved can be used.

Moreover, in the above embodiment, an exposure apparatus furnished with a projection optical system PL was described an example, however the present invention can also be applied to an exposure apparatus and an exposure method which does not use a projection optical system PL. Even in the case where a projection optical system is not used, the exposure light can be shone onto the substrate via optical members such as a mask and lens, and an immersion region can be formed in a predetermined space between these optical elements and the substrate.

Furthermore, the present invention can also be applied to a twin stage type exposure apparatus furnished with a plurality of substrate stages, as disclosed for example in Japanese Unexamined Patent Application, First Publication No. H10-163099, Japanese Unexamined Patent Application, First Publication No. H10-214783 (corresponding to U.S. Pat. No. 6,590,634), Published Japanese Translation No. 2000-505958 of PCT International Application (corresponding to U.S. Pat. No. 5,696,411), and U.S. Pat. No. 6,208,407.

Furthermore, the present invention can also be applied to an exposure apparatus furnished with a substrate stage for holding a substrate; and a measurement stage on which is mounted a reference member formed with a reference mark, and/or various photoelectronic sensors, as disclosed for example, in Japanese Unexamined Patent Application, First Publication No. H11-135400 (corresponding PCT International Publication No. WO 1999/23692) or Japanese Unexamined Patent Application, First Publication No. 2000-164504 (corresponding U.S. Pat. No. 6,897,963).

Furthermore, in the above embodiments, an exposure apparatus in which the liquid is locally filled in the space between the projection optical system PL and the substrate P is used. However, the present invention can be also applied to a liquid immersion exposure apparatus in which exposure is performed in a condition with the whole surface of the target exposure substrate immersed in a liquid, as disclosed for example in Japanese Unexamined Patent Application, First Publication No. H06-124873, Japanese Unexamined Patent Application, First Publication No. H10-303144, and U.S. Pat. No. 5,825,043.

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup elements (CCD), micro machines, MEMS, DNA chips, and reticles or masks.

In the abovementioned embodiments, an optical transmission type mask formed with a predetermined shielding pattern (or phase pattern or dimming pattern) on an optical transmission substrate is used. However instead of this mask, for example as disclosed in U.S. Pat. No. 6,778,257, an electronic mask (called a variable form mask; for example this includes a DMD (Digital Micro-mirror Device) as one type of non-radiative type image display element) for forming a transmission pattern or reflection pattern, or a light emitting pattern, based on electronic data of a pattern to be exposed may be used.

Furthermore the present invention can also be applied to an exposure apparatus (lithography system) which exposes a run-and-space pattern on a substrate P by forming interference fringes on the substrate P, as disclosed for example in PCT International Patent Publication No. WO 2001/035168.

Moreover, the present invention can also be applied to an exposure apparatus as disclosed for example in Japanese Patent No. 2004-519850 (corresponding U.S. patent application Ser. No. 6,611,316), which combines patterns of two masks on a substrate via a projection optical system, and double exposes a single shot region on the substrate at substantially the same time, using a single scan exposure light.

As far as is permitted by the law of the countries specified or selected in this patent application, the disclosures in all of the Japanese Patent Publications and U.S. Patents related to exposure apparatuses and the like cited in the above respective embodiments and modified examples, are incorporated herein by reference.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 9:
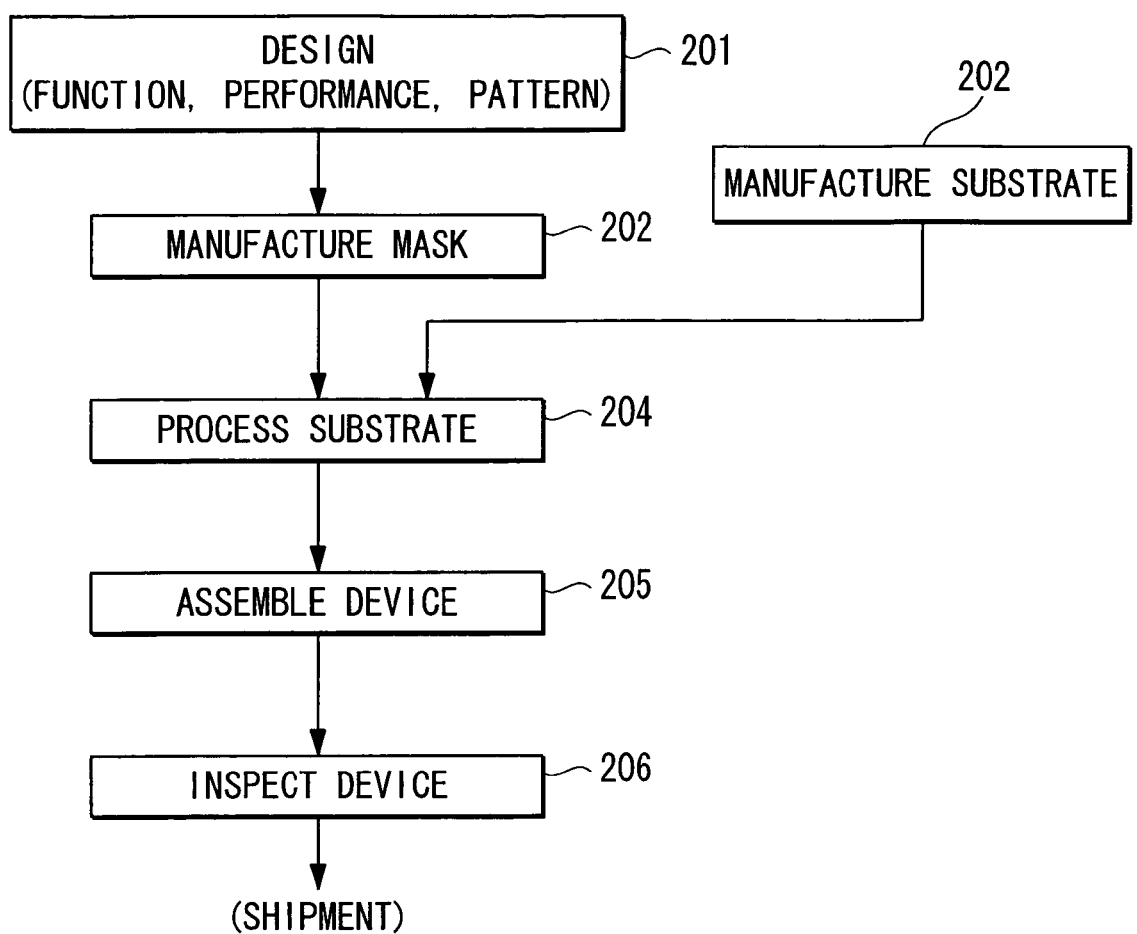
FIG. 9 is a flowchart explaining an example of a manufacturing procedure of a micro device.

As shown in FIG. 9, microdevices such as semiconductor devices are manufactured by going through; a step 201 that performs microdevice function and performance design, a step 202 that creates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing) and etching the developed substrate, a device assembly step (including treatment processes such as a dicing process, a bonding process and a packaging process) 205, and an inspection step 206, and so on.

In accordance with the present invention, information on exposure light in a liquid immersion exposure apparatus can be smoothly measured and an exposure processing can be performed with good accuracy. Therefore, the present invention is extremely useful in an exposure method and apparatus for manufacturing a wide range of products such as semiconductor devices, liquid crystal elements or displays, thin film magnetic heads, CCDs, micromachines, MEMS, DNA chips, and reticles (masks).

What is claimed is:

1. A wafer-shaped sensor used in an exposure apparatus that exposes a wafer via a liquid, the wafer-shaped sensor comprising:
   a light transmission portion that transmits an exposure light having a wavelength of less than 200 nm;
   a receiving portion onto which the exposure light is incident via the liquid and the light transmission portion, wherein the wafer-shaped sensor can be detachably held on a wafer holder which holds the wafer subjected to exposure via the liquid; and
   a base portion that surrounds the light transmission portion, wherein a protection film having a repellency to liquid is formed on an upper surface of the base portion, the protection film extending to an outer periphery of the light transmission portion, and
   the light transmission portion is above the receiving portion and extends beyond an outer periphery of the receiving portion.

2. The wafer-shaped sensor according to claim 1, wherein the receiving portion is located in an inner space of a base material of the base portion on which the light transmission portion is provided.

3. The wafer-shaped sensor according to claim 1, further comprising a transmitter that wirelessly transmits a light reception result of the exposure light at the light receiving portion.

4. An exposure method for exposing a wafer via a liquid, comprising:

holding the wafer-shaped sensor according to claim 1 by a wafer stage;

receiving an exposure light via a liquid and a light transmission portion to measure information on the exposure light, the liquid being disposed between the wafer-shaped sensor and an optical member, the wafer-shaped sensor being located by the wafer stage to oppose the optical member, the optical member transmitting the exposure light having a wavelength of less than 200 nm; and exposing a wafer with the exposure light after the measurement in a state in which the wafer replacing the wafer-shaped sensor is held by the wafer stage.

5. A device manufacturing method using the exposure method according to claim 4.

* * * * *